US011398844B1

(12) United States Patent
Perumana et al.

(10) Patent No.: US 11,398,844 B1
(45) Date of Patent: Jul. 26, 2022

(54) SWITCHED CURRENT-STEERING DIGITAL TRANSMITTER WITH ENCODER BASED UP-CONVERSION

(71) Applicant: Avago Technologies International Sales Pte. Limited, Singapore (SG)

(72) Inventors: Bevin George Perumana, Anaheim, CA (US); Mohyee Mikhemar, Irvine, CA (US); Tirdad Sowlati, Irvine, CA (US); Alvin Lin, Andover, MA (US); Sudharshan Srinivasan, Bengaluru (IN); Wei-Hong Chen, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/206,998

(22) Filed: Mar. 19, 2021

(30) Foreign Application Priority Data

Jan. 31, 2021 (IN) .............................. 202121004184

(51) Int. Cl.
*H04B 1/04* (2006.01)
*H03M 1/66* (2006.01)
*H03H 7/42* (2006.01)

(52) U.S. Cl.
CPC .................. *H04B 1/04* (2013.01); *H03H 7/42* (2013.01); *H03M 1/66* (2013.01)

(58) Field of Classification Search
CPC .............. H04B 1/04; H03H 7/42; H03M 1/66
See application file for complete search history.

(56) References Cited

U.S. PATENT DOCUMENTS

| 2005/0213672 | A1* | 9/2005 | Lin | H03F 3/345 375/257 |
| 2010/0215120 | A1* | 8/2010 | Groe | H04B 1/04 375/297 |
| 2014/0269976 | A1* | 9/2014 | Klepser | H03M 1/66 375/295 |

OTHER PUBLICATIONS

"Behzad Razavi; "The Current-Steering DAC"; IEEE Solid-State Circuits Magazine, Jan. 31, 2018, pp. 11-15."

* cited by examiner

*Primary Examiner* — Nguyen T Vo
(74) *Attorney, Agent, or Firm* — Foley & Lardner LLP

(57) ABSTRACT

Disclosed herein are related to systems and methods for selectively disabling current steering circuitries. In one aspect, the system includes a balun including a first inductor and a second inductor, a first current steering circuit coupled to the first inductor, a second current steering circuit coupled to the first inductor, and a controller coupled to the first current steering circuit and the second current steering circuit. In one aspect, the controller is configured to, based on input data having a first state, apply a first signal and a second signal having a first level to the first current steering circuit and a third signal and a fourth signal having the first level to the second current steering circuit to disable a first current through the second inductor, a second current through the first current steering circuit, and a third current through the second current steering circuit.

20 Claims, 9 Drawing Sheets

SWITCHED CURRENT-STEERING DIGITAL TRANSMITTER WITH ENCODER BASED UP-CONVERSION

CROSS-REFERENCE TO RELATED APPLICATIONS

This application claims the benefit of and priority under 35 U.S.C. § 119(a) to Indian Provisional Patent Application No. 202121004184, filed Jan. 31, 2021, titled "SWITCHED CURRENT-STEERING DIGITAL TRANSMITTER WITH ENCODER BASED UP-CONVERSION," which is incorporated by reference in its entirety for all purposes.

FIELD OF THE DISCLOSURE

This disclosure generally relates to a communication system, including but not limited to selectively disabling current steering circuits of an RF DAC based on input data, according to one or more embodiments.

BACKGROUND OF THE DISCLOSURE

Recent developments in communication and computing devices demand higher linearity, reduced chip area, and reduced power consumption. Traditional analog transmitters occupy large chip area and consume significant power. In one approach, current-steering, digital transmitters using offset binary encoding may reduce chip area and maintain linearity, but may fail to reduce power consumption, which is determined by maximum output power of the transmitter. In another approach, current-steering, digital transmitters using sign-magnitude implementations with global sign-based local oscillator (LO) multiplexing and in-phase and quadrature outputs being combined in a voltage domain have the following limitations: (a) difficulty in closing timing, (b) signed LO feedthrough (LOFT) that acts as a 1-bit modulated LOFT, and (c) duty cycle error that leads to IQ dependency related to non-linearity.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems and methods for selectively disabling current steering circuits of a transmitter based on input data, according to one or more embodiments.

A. Computing and Network Environment

Figure 1A:
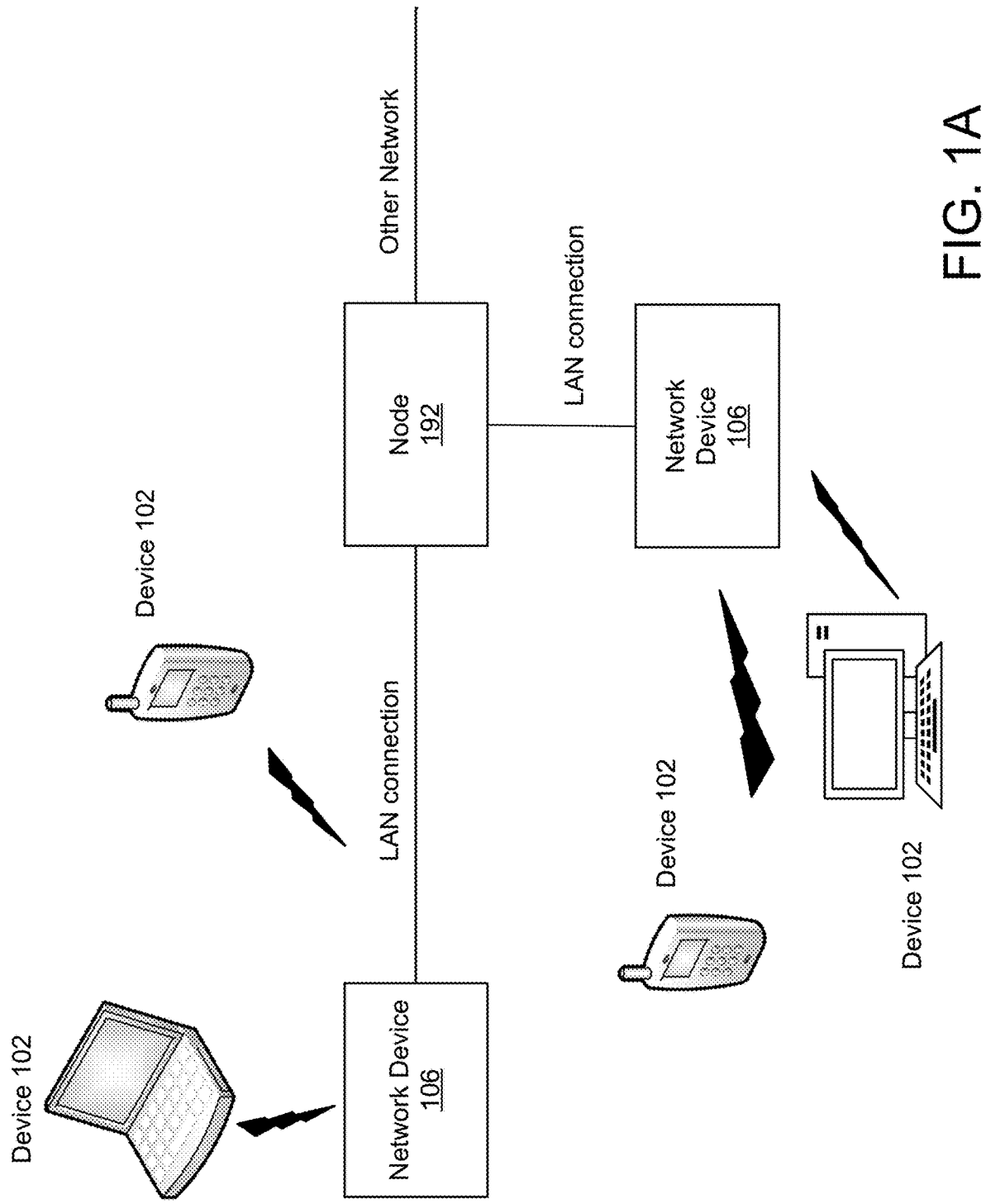
FIG. 1A is a block diagram depicting a network environment including one or more access points in communication with one or more devices or stations, in one or more embodiments.

Prior to discussing specific embodiments of the present solution, it can be helpful to describe aspects of the operating environment as well as associated system components (e.g., hardware elements) in connection with the methods and systems described herein. Referring to FIG. 1A, an embodiment of a network environment is depicted. In brief overview, the network environment includes a wireless communication system that includes one or more access points (APs) 106, one or more wireless communication devices 102 and a network hardware component 192. The wireless communication devices 102 can for example include laptop computers 102, tablets 102, personal computers 102, Internet of Things (IoT) devices 102, and/or cellular telephone devices 102. The details of an embodiment of each wireless communication device 102 and/or AP 106 are described in greater detail with reference to FIGS. 1B and 1C. The network environment can be an ad hoc network environment, an infrastructure wireless network environment, a subnet environment, etc. in one embodiment. The APs 106 can be operably coupled to the network hardware component 192 via local area network connections. The network hardware component 192, which can include a router, gateway, switch, bridge, modem, system controller, appliance, etc., can provide a local area network connection for the communication system. Each of the APs 106 can have an associated antenna or an antenna array to communicate with the wireless communication devices in its area. The wireless communication devices 102 can register with a particular AP 106 to receive services from the communication system (e.g., via a SU-MIMO or MU-MIMO configuration). For direct connections (e.g., point-to-point communications), some wireless communication devices can communicate directly via an allocated channel and communications protocol. Some of the wireless communication devices 102 can be mobile or relatively static with respect to AP 106.

In some embodiments an AP 106 includes a device or module (including a combination of hardware and software) that allows wireless communication devices 102 to connect to a wired network using wireless-fidelity (WiFi), or other standards. An AP 106 can sometimes be referred to as an wireless access point (WAP). An AP 106 can be implemented (e.g., configured, designed and/or built) for operating in a wireless local area network (WLAN). An AP 106 can connect to a router (e.g., via a wired network) as a standalone device in some embodiments. In other embodiments, an AP 106 can be a component of a router. An AP 106 can provide multiple devices access to a network. An AP 106 can, for example, connect to a wired Ethernet connection and provide wireless connections using radio frequency links for other devices 102 to utilize that wired connection. An AP 106 can be implemented to support a standard for sending and receiving data using one or more radio frequencies. Those standards, and the frequencies they use can be defined by the IEEE (e.g., IEEE 802.11 standards). An AP 106 can be configured and/or used to support public Internet hotspots, and/or on a network to extend the network's Wi-Fi signal range.

In some embodiments, the APs 106 can be used for (e.g., in-home or in-building) wireless networks (e.g., IEEE 802.11, Bluetooth, ZigBee, any other type of radio frequency based network protocol and/or variations thereof). Each of the wireless communication devices 102 can include a built-in radio and/or is coupled to a radio. Such wireless communication devices 102 and/or APs 106 can operate in accordance with the various aspects of the disclosure as presented herein to enhance performance, reduce costs and/or size, and/or enhance broadband applications. Each wireless communication device 102 can have the capacity to function as a client node seeking access to resources (e.g., data, and connection to networked nodes such as servers) via one or more APs 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In some embodiments, different types of data can be transmitted via different protocols. In other embodiments, the same types of data can be transmitted via different protocols.

Figure 1B:
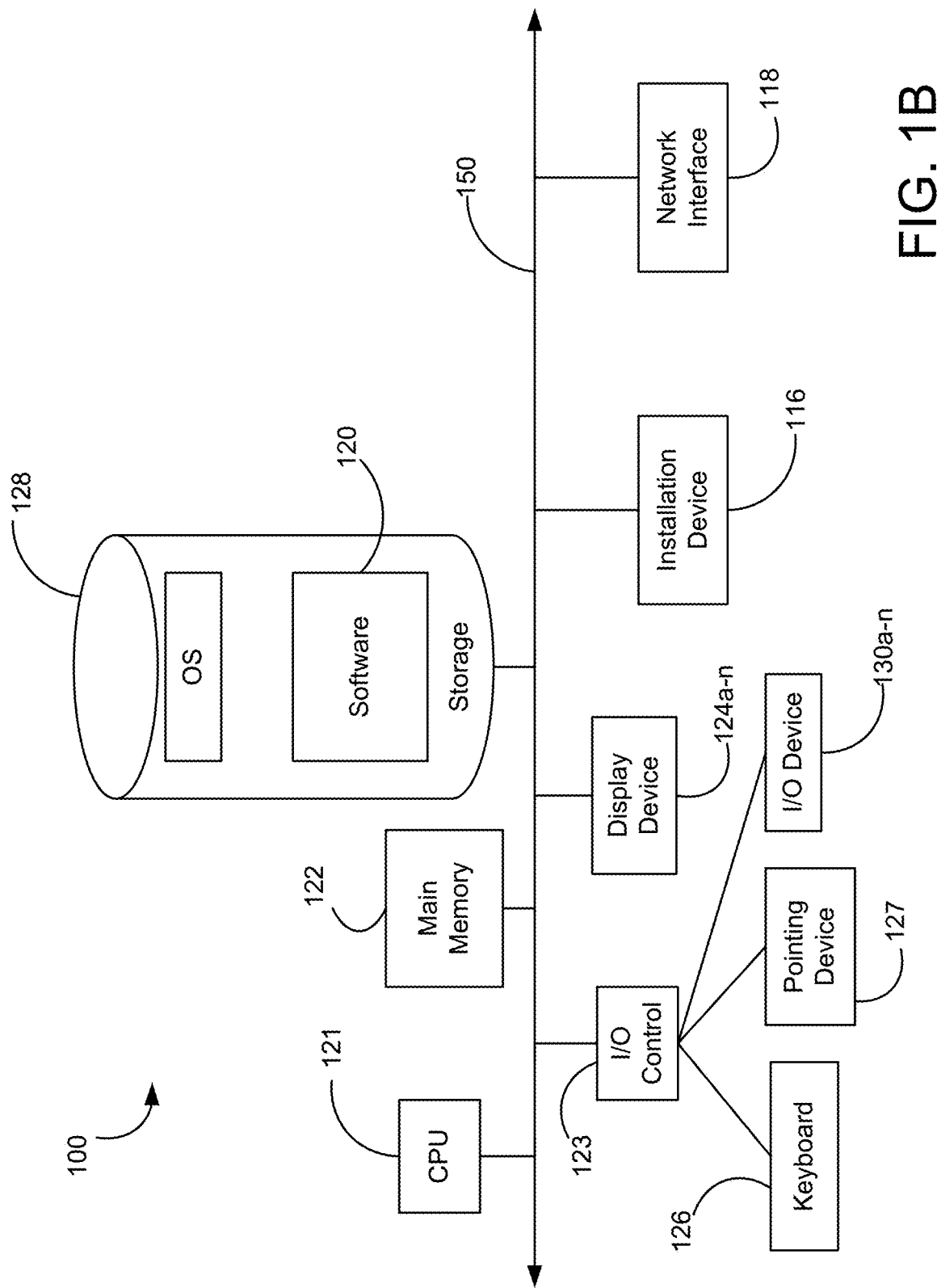
FIGS. 1B and 1C are block diagrams depicting computing devices useful in connection with the methods and systems described herein, in one or more embodiments.
Figure 1C:
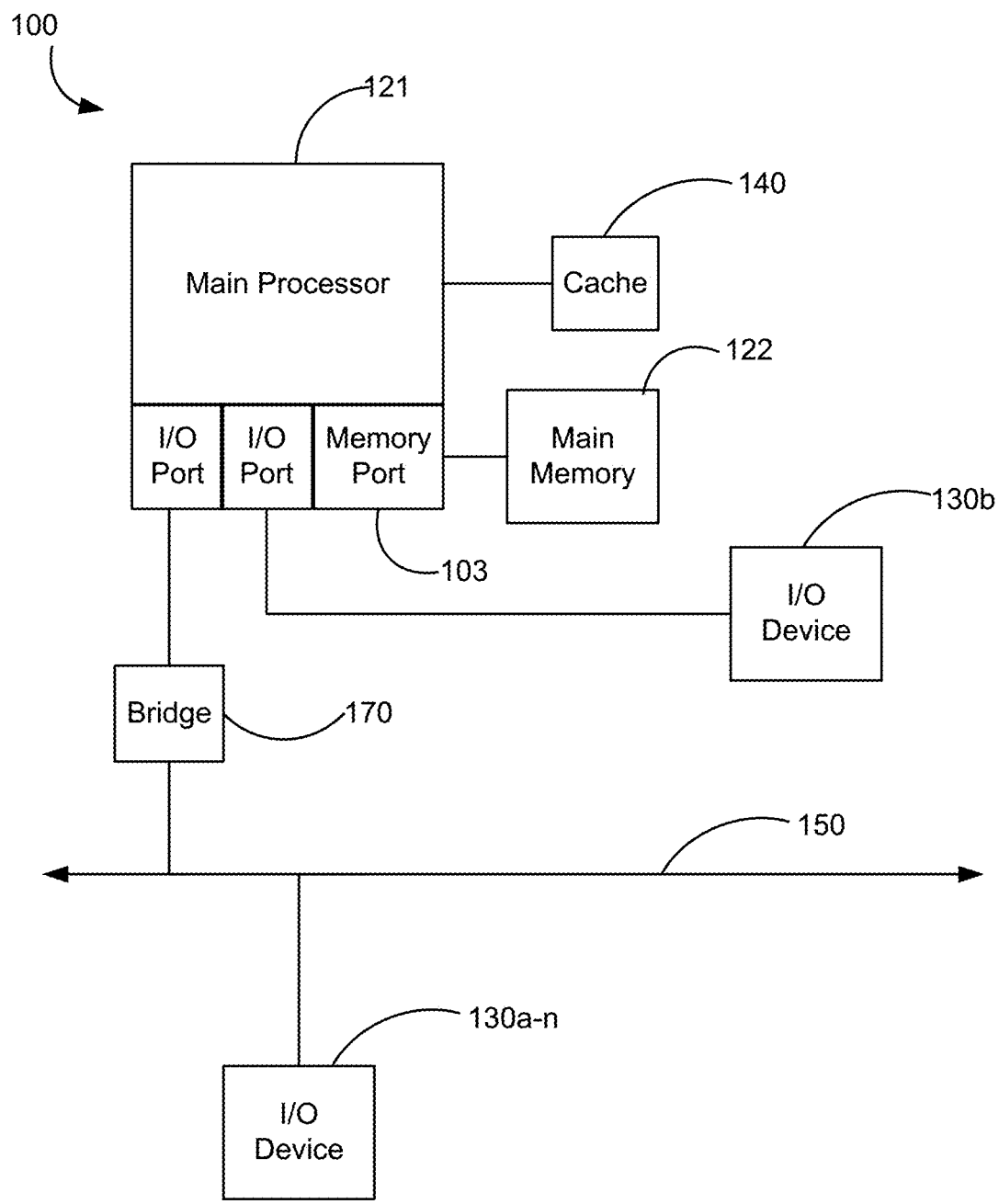

The communications device(s) 102 and access point(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or AP 106. As shown in FIGS. 1B and 1C, each computing device 100 includes a central processing unit 121, and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include an operating system and/or software. As shown in FIG. 1C, each computing device 100 can also include additional optional elements, such as a memory port 103, a bridge 170, one or more input/output devices 130a-130n, and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Santa Clara, Calif.; those manufactured by International Business Machines of White Plains, N.Y.; or those manufactured by Advanced Micro Devices of Sunnyvale, Calif. The computing device 100 can be based on any of these processors, or any other processor (e.g., integrated digital signal processor (DSP)) capable of operating as described herein.

Main memory unit 122 can be one or more memory chips capable of storing data and allowing any storage location to be directly accessed by the microprocessor or central processing unit 121, such as any type or variant of Static random access memory (SRAM), Dynamic random access memory (DRAM), Ferroelectric RAM (FRAM), NAND Flash, NOR Flash and Solid State Drives (SSD). The main memory unit 122 can be based on any of the above described memory chips, or any other available memory chips capable of operating as described herein. In the embodiment shown in FIG. 1B, the processor or central processing unit 121 communicates with main memory unit 122 via a system bus 150 (described in more detail below). FIG. 1C depicts an embodiment of a computing device 100 in which the processor communicates directly with main memory unit 122 via a memory port 103. For example, in FIG. 1C the main memory unit 122 can be DRDRAM.

FIG. 1C depicts an embodiment in which the main processor or central processing unit 121 communicates directly with cache memory 140 via a secondary bus, sometimes referred to as a backside bus. In other embodiments, the main processor or central processing unit 121 communicates with cache memory 140 using the system bus 150. Cache memory 140 typically has a faster response time than main memory unit 122 and is provided by, for example, SRAM, BSRAM, or EDRAM. In the embodiment shown in FIG. 1C, the processor or central processing unit 121 communicates with various I/O devices 130 via a local system bus 150. Various buses can be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor or central processing unit 121 can use an Advanced Graphics Port (AGP) to communicate with the display 124. FIG. 1C depicts an embodiment of a computer device 100 in which the main processor or central processing unit 121 can communicate directly with I/O device 130b, for example via HYPERTRANSPORT, RAPIDIO, or INFINIBAND communications technology. FIG. 1C also depicts an embodiment in which local busses and direct communication are mixed: the processor or central processing unit 121 communicates with I/O device 130a using a local interconnect bus while communicating with I/O device 130b directly.

A wide variety of I/O devices 130a-130n can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium or installation device 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, Calif.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., configured and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to the network 104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, IEEE 802.11ax, CDMA, GSM, WiMax and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 can include or be connected to one or more display devices 124a-124n. As such, any of the I/O devices 130a-130n and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In some embodiments, any portion of the operating system of the computing device 100 can be configured for using multiple displays 124a-124n. In further embodiments, an I/O device 130 can be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 100 of the sort depicted in FIGS. 1B and 1C can operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer device 100 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. In some embodiments, the computing device 100 can have different processors, operating systems, and input devices consistent with the device. For example, in one embodiment, the computing device 100 is a smart phone, mobile device, tablet or personal digital assistant. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. Selectively Disabling Current Steering Circuitries Based on Input Data

Various embodiments disclosed herein are related to selectively disabling current steering circuitries (also referred to as "current steering circuits" herein) to reduce current consumption in a digital transmitter. Disclosed herein is related to a two-bit encoding based up-conversion. In some implementations, the up-conversion is performed without global sign-based local oscillator (LO) multiplexing and performed with I and Q outputs being combined in current domain at the output. A first bit of the two-bit encoding may represent an output for a first half of a carrier period and a second bit of the two-bit encoding may represent the output for a second half of the carrier period. In some embodiments, the two-bit encoding provides four states, including three states in which the current steering circuitry is on or enabled, and a fourth state in which the current steering circuitry is off or disabled, thereby reducing power consumption.

Additionally, signals such as OFDM signals may have a larger peak to average ratio than other signals, which means an instantaneous signal amplitude may be close to zero and rarely close to full-scale. Systems without the disclosed embodiments may use offset binary to encode such data, which can waste power as most of the unit cells may be cancelling each other to implement low amplitude (close to zero) signals. Systems without the disclosed embodiments may use sign-magnitude implementation with global LO sign-muxing, which may result in sign-muxed LO leakage and timing closure issues when the sign is changing. To address these issues, embodiments disclosed herein may include a two-bit encoding scheme for each unary/binary cell: a first state (e.g., [0, 0]) for zero by cancellation; a second state (e.g., [1, 0]) for an output of a first polarity (e.g., +1), a third state (e.g., [0, 1]) for an output of a second polarity (e.g., −1); and a fourth state (e.g., gated power-off state, [1, 1]) for zero by powering down the unit. The gated power-off state may enable power savings in current-steering cells for high peak-to-average signals and/or signals at high back-off.

Embodiments disclosed herein allow selectively turning off current-steering units depending on signal amplitude. In some embodiments, in order to reduce an impact of current-steering units turning on and off, a programmable number of units can be left on, independent of the signal's instantaneous envelope/amplitude, and the remaining number of units can be turned on when scheduled to provide signals to the output. This could be set as a function of expected average power, for example, instead of peak signal amplitude which could be very infrequent. In some embodiments, in order to allow sufficient time to turn on, a programmable number of units could be turned on in advance with a margin over the signal's instantaneous envelop/amplitude, and the remaining number of units can be turned on when scheduled to provide signals to the output. By either leaving the programmable number of units on or by turning the programmable number of units on in advance of a scheduled time to provide signals to the output, embodiments of the system advantageously maintain performance (e.g., error vector magnitude, spectral mask, etc.) while reducing power consumption in the aggregate due to turning off the remaining number of units when not scheduled to provide signals to the output.

Advantageously, embodiments disclosed herein may have on-par or lower power consumption compared to analog implementations and can enable power saving as output power is backed off, particularly for modulation schemes with large peak-to-average-power ratio (PAPR) like orthogonal frequency-division multiplexing (OFDM). Moreover, embodiments disclosed herein can provide for a small die area for a transmitter (Tx) radio, including an area shrink of 2× compared to the analog Tx line-up. Also, embodiments disclosed herein can be applied to wide band operation such as 20 MHz, 40 MHz, 80 MHz, 160 MHz, 320 MHz, and higher modulation bandwidths. Beneficially, embodiments disclosed herein have low sensitivity to supply noise. Moreover, embodiments disclosed herein allow timing closure for radio frequency (RF) operation at 600 MHz to 10 GHz or higher. Also, embodiments disclosed herein maintain linearity advantages of current steering, has no inherent nonlinearity that creates counter inter-modulation terms (CIM3), and has no inherent impairment that requires 2-D digital predistortion. Advantageously, embodiments disclosed herein are scalable as process node advances.

Various embodiments disclosed herein are related to a communication system. In some embodiments, the system includes a balun including a first inductor and a second inductor coupled to the first inductor, a first current steering circuit coupled to the first inductor, a second current steering circuit coupled to the first inductor, and a controller coupled to the first current steering circuit and the second current steering circuit. In some embodiments, the controller is configured to, based on input data having a first state, apply (i) a first signal having a first level and a second signal having a second level to the first current steering circuit and (ii) a third signal having the second level and a fourth signal having the first level to the second current steering circuit to generate a first current through the second inductor. In some embodiments, the controller is configured to, based on the input data having a second state, apply (i) the first signal having the second level and the second signal having the second level to the first current steering circuit and (ii) the third signal having the second level and the fourth signal having the second level to the second current steering circuit to disable (i) the first current through the second inductor, (ii) a second current through the first current steering circuit, and (iii) a third current through the second current steering circuit.

In some embodiments, the first inductor includes a first port, a second port, and a third port between the first port and the second port. In some embodiments, the third port is coupled to a source providing a reference voltage. In some embodiments, the first current steering circuit includes a first output coupled to the first port of the first inductor and a second output coupled to the second port of the first inductor. In some embodiments, the second current steering circuit includes a third output coupled to the second port of the first inductor and a fourth output coupled to the first port of the first inductor.

In some embodiments, in response to the input data having the first state, the second current flows through the third port of the first inductor, the first port of the first inductor, and the first output of the first current steering circuit in that sequence, and the third current flows through the third port of the first inductor, the first port of the first inductor, and the fourth output of the second current steering circuit in that sequence. In some embodiments, in response to the input data having a third state, the second current flows through the third port of the first inductor, the second port of the first inductor, and the second output of the first current steering circuit in that sequence, and the third current flows through the third port of the first inductor, the second port of the first inductor, and the third output of the second current steering circuit in that sequence. In some embodiments, in response to the input data having a fourth state, the second current flows through the third port of the first inductor, the first port of the first inductor, and the first output of the first current steering circuit in that sequence, and the third current flows through the third port of the first inductor, the second port of the first inductor, and the third output of the second current steering circuit in that sequence to enable the second current from the first current steering circuit to cancel the third current from the second current steering circuit.

In some embodiments, the first current steering circuit includes a first current source, and a first differential pair circuit including a first transistor and a second transistor. In some embodiments, the first transistor is coupled between (i) the first current source and (ii) the first output and the second transistor is coupled between (i) the first current source and (ii) the second output. In some embodiments, the first current steering circuit includes a first switch transistor. In some embodiments, the first transistor and the first switch transistor are coupled to each other in series between (i) the first current source and (ii) the first output. In some embodiments, the first current steering circuit includes a second switch transistor. In some embodiments, the second transistor and the second switch transistor are coupled to each other in series between (i) the first current source and (ii) the second output.

In some embodiments, the second current steering circuit includes a second current source, and a second differential pair circuit including a third transistor and a fourth transistor. In some embodiments, the third transistor is coupled between (i) the second current source and (ii) the third output and the fourth transistor is coupled between (i) the second current source and (ii) the fourth output. In some embodiments, the second current steering circuit includes a third switch transistor. In some embodiments, the third transistor and the third switch transistor are coupled to each other in series between (i) the second current source and (ii) the third output. In some embodiments, the second current steering circuit includes a fourth switch transistor. In some embodiments, the fourth transistor and the fourth switch transistor are coupled to each other in series between (i) the second current source and (ii) the fourth output. In some embodiments, the controller is configured to apply the first signal to the first transistor, the second signal to the second transistor, the third signal to the third transistor, and the fourth signal to the fourth transistor.

Various embodiments disclosed herein are related to a communication system. In some embodiments, the system includes a balun including a first inductor and a second inductor coupled to the first inductor, a first current steering circuit coupled to the first inductor, a second current steering circuit coupled to the first inductor, and a controller coupled to the first current steering circuit and the second current steering circuit. In some embodiments, the controller is configured to, based on input data having a first state, apply (i) a first signal having a first level and a second signal having a second level to the first current steering circuit and (ii) a third signal having the first level and a fourth signal having the second level to the second current steering circuit to generate a first current through the first current steering circuit that cancels a second current through the second current steering circuit. In some embodiments, the controller is configured to, based on the input data having a second state, apply (i) the first signal having the second level and the second signal having the second level to the first current steering circuit and (ii) the third signal having the second level and the fourth signal having the second level to the second current steering circuit to disable (i) a third current through the second inductor, (ii) the first current through the first current steering circuit, and (iii) the second current through the second current steering circuit.

Various embodiments disclosed herein are related to a communication system. In some embodiments, the system includes a balun including a first inductor and a second inductor coupled to the first inductor, a first current steering circuit coupled to the first inductor, a second current steering circuit coupled to the first inductor, and a controller coupled to the first current steering circuit and the second current steering circuit. In some embodiments, the controller is configured to, based on input data having a first state, apply (i) a first signal having a first level and a second signal having the first level to the first current steering circuit and (ii) a third signal having the first level and a fourth signal having the first level to the second current steering circuit to disable (i) a first current through the second inductor, (ii) a second current through the first current steering circuit, and (iii) a third current through the second current steering circuit. In some embodiments, the first inductor includes a first input and a second input. In some embodiments, the first inductor includes a first port and a second port. In some embodiments, the first current steering circuit includes a first output coupled to the first port of the first inductor and a second output coupled to the second port of the first inductor. In some embodiments, the second current steering circuit includes a third output coupled to the second port of the first inductor and a fourth output coupled to the first port of the first inductor.

Figure 2:
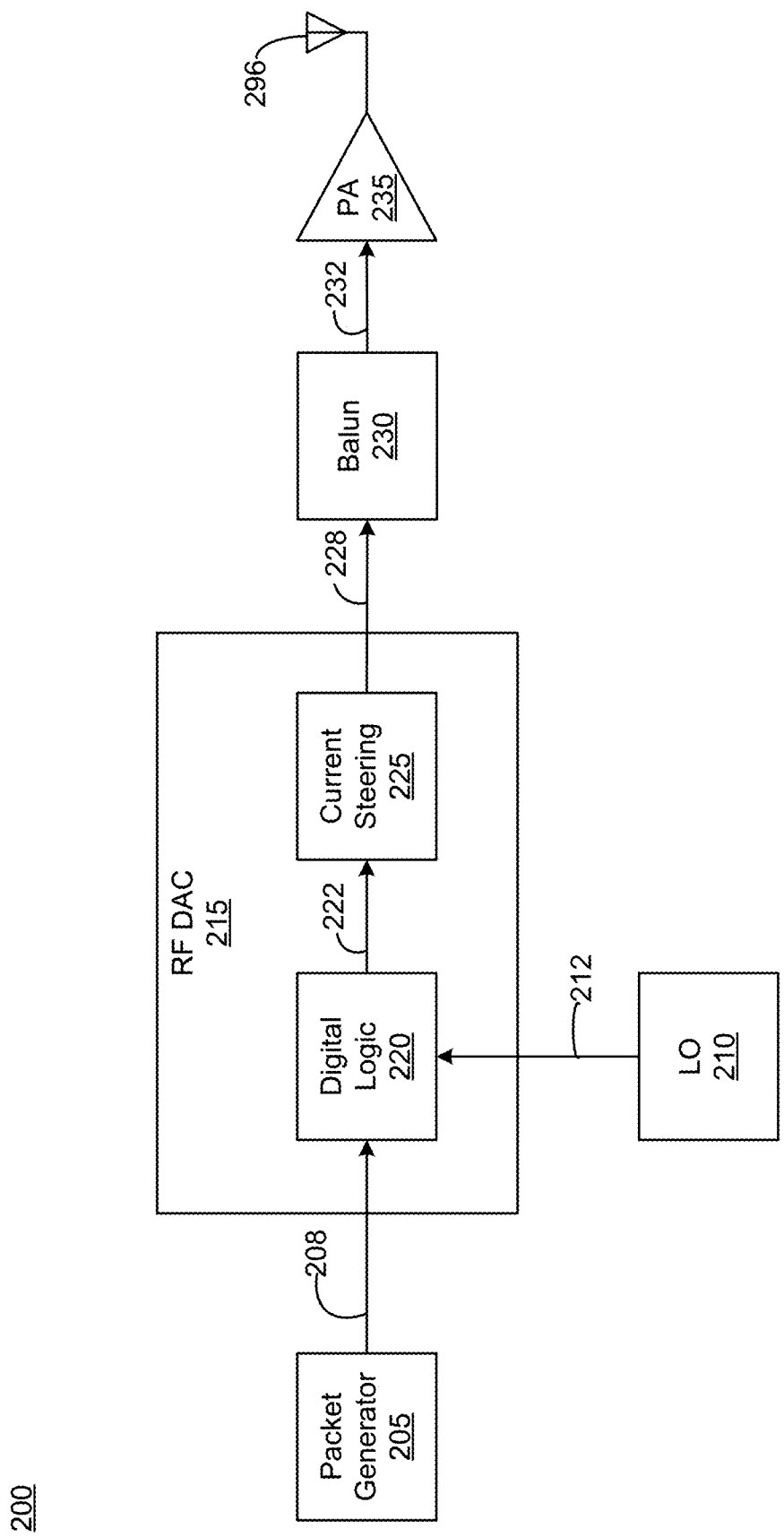
FIG. 2 is a block diagram depicting a communication system, in one or more embodiments.

Referring to FIG. 2, illustrated is a block diagram depicting a communication system 200, in one or more embodiments. In some embodiments, the communication system 200 includes an antenna 296, a packet generator 205, local oscillator (LO) 210, radio frequency (RF) digital-to-analog converter (DAC) 215, a balun 230, and a power amplifier (PA) 235. In some embodiments, the RF DAC 215 (also referred to as a "RF transmitter 215" herein) includes digital logic circuit 220 and current steering circuitry 225. In some embodiments, these components are implemented as hardware, software, or a combination of them. In some implementations, these components are implemented on an application specific integrated circuit (ASIC), a field programmable gate logic (FPGA) or a combination of them. In one aspect, these components operate together to up-convert and transmit communication signals while saving current. In some embodiments, the communication system 200 includes more, fewer, or different components than shown in FIG. 2.

In some embodiments, the packet generator 205 is a component that generates a packet 208 for transmission. In one implementation, the packet generator 205 is implemented as a digital logic circuit. In one configuration, the packet generator 205 includes an output port coupled to an input port of the RF DAC 215. In one approach, the packet generator 205 generates one or more packets including content data corresponding to a target baseband signal for transmission in a digital representation. In one configuration, the packet generator 205 includes an output port that provides the packet 208 to the RF DAC 215 (specifically, to the digital logic circuit 220).

In some embodiments, LO 210 is a component that generates an LO signal 212. In some embodiments, the LO signal 212 is used to up-convert the packet 208. In some embodiments, the LO 210 includes one or more of a synthesizer, a divider, or an LO buffer. In one configuration, the LO 210 includes an output port that provides the LO signal 212 to the RF DAC 215 (e.g., to the digital logic circuit 220).

In one configuration, the RF DAC 215 converts the packet 208 in the digital representation into an analog representation to generate an RF signal 228. In one configuration, the RF DAC 215 includes a first input port coupled to the output port of the packet generator 205 and a second input port coupled to the output port of the LO 210.

In some embodiments, the digital logic circuit 220 (e.g., controller, mixer) receives the packet 208 and the LO signal 212. In some embodiments, the digital logic circuit 220 generates the RF data bits 222 based on the packet 208 and the LO signal 212. In some embodiments, the digital logic circuit 220 clocks data bits of the packet 208 with the LO signal 212. In some embodiments, the digital logic circuit 220 transforms/processes the clocked data bits using logic circuits and multiplexes the transformed data to generate RF data bits 222. In some embodiments, the digital logic circuit 220 up-converts the packet 208 by clocking the packet 208 with the LO signal 212 and multiplexing the clocked data bits. In one aspect, the RF DAC 215 up-converts the packet 208 at a baseband frequency (e.g., between DC and a few hundred MHz) to generate the RF signal 228 at RF (e.g., over 1 GHz). In some embodiments, the RF data bits 222 is in a digital representation. In one configuration, the digital logic circuit 220 includes a first input port coupled to the output port of the packet generator 205, a second input port coupled to the output port of the LO 210, and an output port.

In some embodiments, the current steering circuitry 225 receives the RF data bits 222. In some embodiments, the current steering circuitry 225 generates the RF signal 228 based on the RF data bits 222. In some embodiments, the current steering circuitry 225 converts the RF data bits 222 in the digital representation into an analog representation to generate the RF signal 228. In one configuration, the current steering circuitry 225 includes an input port coupled to the output port of the digital logic circuit 220 and an output port. In some embodiments, the RF signal 228 is a differential signal.

In some embodiments, the balun 230 receives the RF signal 228. In some embodiments, the balun 230 generates a converted RF signal 232 based on the RF signal 228. In one configuration, the balun 230 includes an input port coupled to the output port of the RF DAC 215 (specifically, the current steering circuitry 225) and an output port. In this configuration, the balun 230 may perform impedance transformation, such that output of the balun 230 may have, for example, 50Ω impedance to drive the subsequent component (e.g., power amplifier 235 or antenna 296).

In some embodiments, the power amplifier 235 is a component that amplifies the converted RF signal 232 for transmission. In one implementation, the power amplifier 235 is implemented as an analog circuit. In one configuration, the power amplifier 235 includes an input port coupled to the output port of the balun 230 and an output port coupled to an antenna 296. In some embodiments, the components 205, 210, 220, 225, and 230 are implemented on a single integrated circuit (e.g., a system on chip), where the power amplifier 235 is implemented on a separate integrated circuit. The power amplifier 235 may amplify the converted RF signal 232 and transmit the amplified RF signal through an antenna 296 for communicating with another communication system. In some embodiments, the power amplifier 235 is omitted, and the antenna 296 is coupled to the output of the balun 230.

Figure 3:
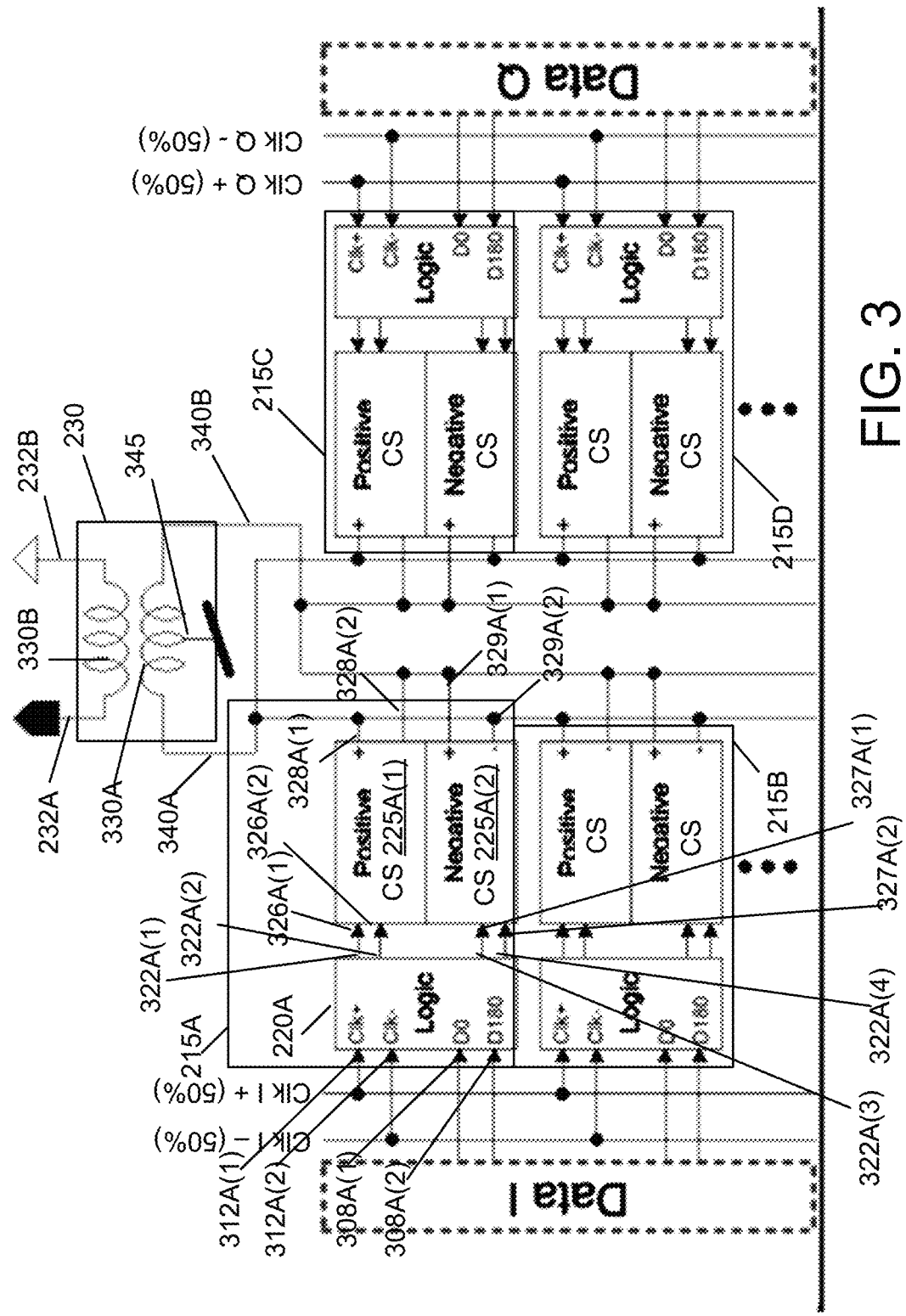
FIG. 3 is a block diagram depicting the communication system in FIG. 2, in one or more embodiments.

Referring to FIG. 3, illustrated is a block diagram depicting a communication system 300, in one or more embodiments. In some embodiments, the communication system 300 includes RF DACs 215A-215N, which are multiple instances of the RF DAC 215 of FIG. 2. For simplicity RF DAC 215A, 215B, 215C, 215D are shown. Each RF DAC instance includes a digital logic circuit instance similar to the digital logic circuit 220 and two current steering circuitry instances similar to the current steering circuitry 225. For example, RF DAC 215A includes a digital logic circuit 220A and current steering circuitries 225A(1)-225A(2). Each of the RF DACs 215B-215N is similar to the RF DAC 215A. The current steering circuitries 225A(1)-225A(2) may be referred to as differential current steering circuitries or differential cells (e.g., differential binary cells, differential unary cells).

In some embodiments, each of the digital logic circuits receives a different data tuple (e.g., two-bit data tuple, data input, etc.) of the packet 208. In some embodiments, the packet 208 is separated into in-phase data and quadrature data. In some embodiments, half of the digital logic circuits each receive a different data tuple from the in-phase data and the other half of the digital logic circuits each receive a different data tuple from the quadrature data. The digital logic circuit 220A includes an input port 308A(1) for receiving a first data bit (e.g., first half of the carrier such as I0, Q90, or more generally, D0), of a first data tuple of the packet 208 and an input port 308A(2) for receiving a second data bit, (e.g., second half of the carrier such as I180, Q270, or more generally, D180), of a first data tuple of the packet 208. In some embodiments, the input ports 308A(1) and 308A(2) are coupled to the packet generator 205.

In some embodiments, half of the digital logic circuits receive a first pair of LO signals (e.g., in-phase LO signals such as Clk I+ and Clk I−) of the LO signal 212, and the other half of the digital logic circuits receive a second pair of LO signals (quadrature phase LO signals such as Q+ and Q−) of the LO signal 212, that are 90 degrees shifted from the first pair of LO signals. The digital logic circuit 220A includes an input port 312A(1) for receiving a first LO signal Clk I+, and an input port 312A(2) for receiving a second LO signal Clk I−. In some embodiments, the first and second LO signals are 180 degrees shifted from each other (e.g., inverted from each other). In some embodiments, the input ports 312A(1) and 312A(2) are coupled to the LO 210.

In some embodiments, each logic circuit 220 provides (e.g., sends) a number of data bits of the RF data bits 222 based on the data tuple received. The digital logic circuit 220A includes an output port 322A(1) for providing a first data bit of the RF data bits 222, an output port 322A(2) for providing a second data bit of the RF data bits 222, an output port 322A(3) for providing a third data bit of the RF data bits 222, and an output port 322A(4) for providing a fourth data bit of the RF data bits 222.

In some embodiments, each current steering circuitry 225 receives a number of data bits from one of the logic circuits 220. The current steering circuitry 225A(1) includes an input port 326A(1) for receiving the first data bit and an input port 326A(2) for receiving the second data bit. The input port 326A(1) is coupled to the output port 322A(1) of the digital logic circuit 220A, and the input port 326A(2) is coupled to the output port 322A(2) of the digital logic circuit 220A. The current steering circuitry 225A(2) includes an input port 327A(1) for receiving the third data bit and an input port 327A(2) for receiving the fourth data bit. The input port 327A(1) is coupled to the output port 322A(3) of the digital logic circuit 220A, and the input port 327A(2) is coupled to the output port 322A(4) of the digital logic circuit 220A.

In some embodiments, each current steering circuitry 225 provides a number of data signals of the RF signal 228. In one configuration, the current steering circuitry 225A(1) includes an output port 328A(1) for selectively providing a first data signal of the RF signal 228, an output port 328A(2) for selectively providing a second data signal of the RF signal 228, an output port 329A(1) for selectively providing a third data signal of the RF signal 228, an output port 329A(2) for selectively providing a fourth data signal of the RF signal 228. In some embodiments, each of the first, second, third, and fourth data signals includes a current. In one aspect, pairs of output ports of a current steering circuitry are referred to as differential ports. For example, collectively, the output port 328A(1) and the output port 328A(2) are referred to as a first differential output port in which 328A(1) is a positive output port and 328A(2) is a negative output port. Likewise, collectively, the output port 329A(1) and the output port 329A(2) can be referred to as a second differential output port in which 329A(1) is a positive output port and 329A(2) is a negative output port.

In some embodiments, the communication system 300 includes the balun 230. In some embodiments, the balun 230 includes a primary inductor, or other electro-magnetic element, 330A and a secondary inductor 330B coupled (e.g., electro-magnetically coupled), or configured to be coupled, to the primary inductor 330A through electromagnetic fields. In some embodiments, the primary inductor 330A includes a first end, a second end, and a midpoint. In some embodiments, the secondary inductor 330B includes a third end and a fourth end.

The balun 230 includes a port 340A, e.g., at the first end of the primary inductor 330A, a port 340B, e.g., at the second end of the primary inductor 330A, and a port 345, e.g., at the midpoint of the primary inductor 330A. The port 345 may be coupled to a component or a voltage source providing a reference voltage (e.g., VDD or ground). In some embodiments, each of the current steering circuitries 225 has at least one output port coupled to the port 340A of the balun 230 and at least one output port coupled to the port 340B of the balun 230. For example, the output port 328A(1) of the current steering circuitry 225A(1) is coupled to the port 340A of the balun 230, the output port 328A(2) of the current steering circuitry 225A(1) is coupled to the port 340B of the balun 230, the output port 329A(1) of the current steering circuitry 225A(2) is coupled to the port 340B of the balun 230, and the output port 329A(2) of the current steering circuitry 225A(2) is coupled to the port 340A of the balun 230. Such a connection may be referred to as a cross-coupled connection because the positive output port (e.g., 328A(1)) of the current steering circuitry 225A(1) is coupled to the same input port as the negative output port (e.g., 329A(2)) of the current steering circuitry 225A(2), and the positive output port (e.g., 329A(1)) of the current steering circuitry 225A(2) is coupled to the same input port as the negative output port (e.g., 328A(2)) of the current steering circuitry 225A(1). Other current steering circuitries 225 for I or Q data may be connected to the balun 230 in a similar manner. In some embodiments, the port 340A of the balun 230 receives a fifth data signal, which is based on (e.g., a sum of) the first signal of the current steering circuitry 225A(1) and the fourth signal of the current steering circuitry 225A(2). The port 340B of the balun 230 receives a sixth data signal, which is based on (e.g., a sum of) the second signal of the current steering circuitry 225A(1) and the third signal of the current steering circuitry 225A(2). The first signal may be a current through the output port 328A(1) of the current steering circuitry 225A(1) and the second signal may be the current through the output port 328A(2) of the current steering circuitry 225A(1). The third signal may be a current through the output port 329A(1) of the current steering circuitry 225A(2) and the fourth signal may be the current through the output port 329A(2) of the current steering circuitry 225A(2). The fifth signal can be a current flowing from the port 345 to the port 340A and the sixth signal can be a current flowing from the port 345 to the port 340B.

The balun 230 includes an port 232A, e.g., at the third end of the secondary inductor 330B and an port 232B, e.g., at the fourth end of the secondary inductor 330B. A seventh signal provided by the port 232A of the balun 230 may be based on the fifth signal received by the port 340A and the sixth signal received by the port 340B. An eighth signal provided by the port 232B of the balun 230 may be based on the fifth signal received by the port 340A and the sixth signal received by the port 340B. The seventh signal may be a current flowing through the port 232A and the eighth signal may be a current flowing through the port 232B. The seventh signal provided by the port 232A may have an opposite polarity, or substantially opposite polarity, of the eighth signal provided by the port 232B. For example, the seventh signal and the eighth signal can be described, collectively, as a current flowing through the secondary inductor 330B. In some embodiments, the seventh signal is a scaling factor multiplied by a difference of the fifth signal and the sixth signal. In some embodiments, the scaling factor is based on (e.g., proportional to) a ratio of the windings of the secondary inductor 330B and the windings of the primary inductor 330A.

In some embodiments, a data tuple of the packet 208 can have one of four states. The one of four states may be encoded in two bits of the data tuple, in some embodiments. The data bits of the RF data bits 222, the data signals of the RF signals 228, and the seventh and eighth signals (e.g., the current) of the secondary inductor 330B may be based on the data tuple of the packet 208. For example, if the data tuple is a first state (e.g., [ground, ground], [0,0], etc.), the first data bit provided by the output port 322A(1) is at a first level (e.g., VDD or 1), the second bit provided by the output port 322A(2) is at a second level (e.g., ground or 0), the third bit provided by the output port 322A(3) is at the first level, and the fourth bit provided by the output port 322A(4) is at the second level. The current steering circuitry 225A(1) may generate the first signal and disable the second signal, and the current steering circuitry 225A(2) may generate the third signal and disable the fourth signal. The port 340A of the balun 230 may receive the first signal provided by the output port 328A(1) and the port 340B of the balun 230 may receive the third signal provided by the output port 329A(1). The first signal and the third signal may cancel each other at the secondary inductor 330B to disable the seventh signal provided by the port 232A of the balun 230 and the eighth signal provided by the port 232B of the balun 230.

In one approach, if the data tuple is a second state (e.g., [VDD, ground], [1,0], etc.), the first data bit provided by the output port 322A(1) is at the first level (e.g., VDD or 1), the second bit provided by the output port 322A(2) is at the second level (e.g., ground or 0), the third bit provided by the output port 322A(3) is at the second level, and the fourth bit provided by the output port 322A(4) is at the first level. The current steering circuitry 225A(1) may generate the first signal and disables the second signal, and the current steering circuitry 225A(2) may generate the fourth signal and disables the third signal. The port 340A of the balun 230 may receive the first signal provided by the output port 328A(1) and the fourth signal provided by the output port 329A(2) to generate the fifth signal. The fifth signal may be provided to the secondary inductor 330B to generate the seventh signal provided by the port 232A of the balun 230 and the eighth signal provided by the port 232B of the balun 230.

In one approach, if the data tuple is a third state (e.g., [ground, VDD], [0,1], etc.), the first data bit provided by the output port 322A(1) is at the second level (e.g., ground or 0), the second bit provided by the output port 322A(2) is at first level (e.g., VDD or 1), the third bit provided by the output port 322A(3) is at the first level, and the fourth bit provided by the output port 322A(4) is at the second level. The current steering circuitry 225A(1) may generate the second signal and disable the first signal, and the current steering circuitry 225A(2) may generate the third signal and disable the fourth signal. The port 340B of the balun 230 may receive the second signal provided by the output port 328A(2) and the third signal provided by the output port 329A(1) to generate the sixth signal. The sixth signal may be provided to the secondary inductor 330B to generate a ninth signal provided by the port 232A of the balun 230 and a tenth signal provided by the 232B of the balun 230. The ninth signal may be a current flowing through the port 232A and the tenth signal may be a current flowing through the port 232B. In one aspect, the ninth signal has an opposite polarity, or substantially opposite polarity, of the tenth signal. In some embodiments, the ninth signal is same as the eighth signal and the tenth signal is same as the seventh signal.

In one approach, if the data tuple is a fourth state (e.g., [VDD, VDD], [1,1], etc.), the first data bit provided by the output port 322A(1) is at the second level (e.g., ground or 0), the second bit provided by the output port 322A(2) is at the second level, the third bit provided by the output port 322A(3) is at the second level, and the fourth bit provided by the output port 322A(4) is at the second level. The current steering circuitry 225A(1) may disable the first signal provided by the output port 328A(1) and the second signal provided by the output port 328A(2), and the current steering circuitry 225A(2) may disable the third signal provided by the output port 329A(1) and the fourth signal provided by the output port 329A(2). The balun 230 may disable the seventh signal provided by the port 232A and the eighth signal provided by the port 232B. Advantageously, the fourth state may reduce power consumption (e.g., current consumption) by disabling the currents of one or more of the current steering circuitries 225 (e.g., current steering circuitries 225A(1) and 225A(2)).

A table of the four states is provided below:

| Data | 0 | 1 | 1 | Gated OFF |
|---|---|---|---|---|
| Sign | N/A | + | − | N/A |
| [D0, D180] | [0,0] | [1,0] | [0,1] | [1,1] |

Figure 4:
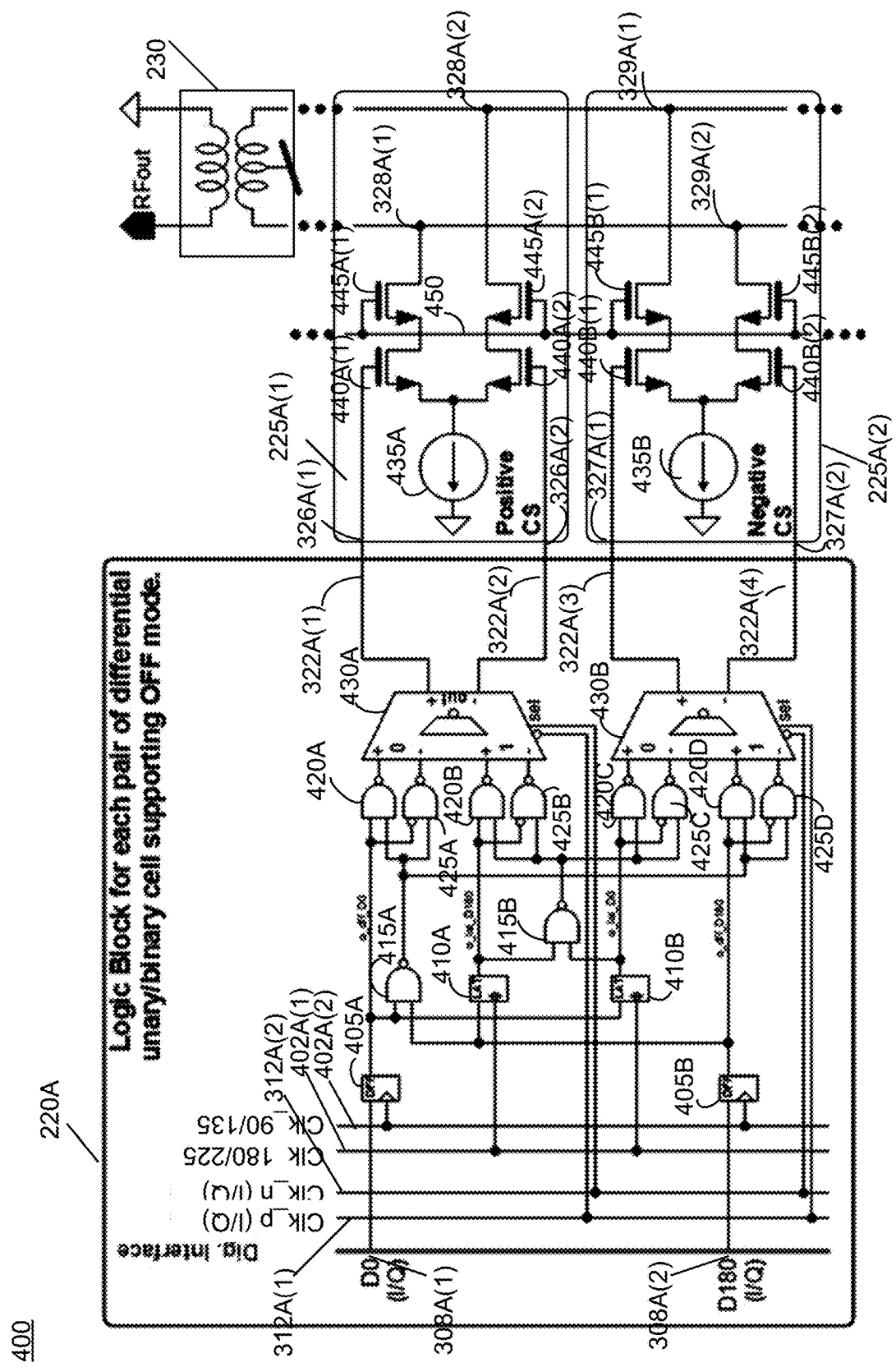
FIG. 4 is a circuit diagram of the communication system in FIG. 2, in one or more embodiments.

Referring now to FIG. 4, illustrated is a circuit diagram 400 of the communication system 300, in one or more embodiments. In some embodiments, the circuit diagram 400 is shown for an interface running at half a carrier frequency (Fc/2). Some implementations can enable the interface to run at Fc or higher by using, for example, a 2-to-1 serializer. In some embodiments, the circuit diagram 400 includes the digital logic circuit 220A of FIG. 3. The digital logic circuit 220A may include additional input ports 402A(1) and 402A(2) for receiving additional LO signals. The additional LO signals received by the ports 402A(1) and 402A(2) can have a frequency that is half the frequency of the LO signals received by the input ports 312A(1) and 312A(2). In some embodiments, the LO signal received by the port 402A(1) and the LO signal received by the port 402A(2) are 180 degrees shifted from each other.

In some embodiments, the digital logic circuit 220A includes a flip-flop (e.g., a D flip-flop) 405A having an input port coupled to the input port 308A(1) of the digital logic circuit 220A, a select port coupled to the input port 402A(2) of the digital logic circuit 220A, and an output port. In some embodiments, the digital logic circuit 220A includes a flip-flop 405B having an input port coupled to the input port 308A(2) of the digital logic circuit 220A, a select port coupled to the input port 402A(2) of the digital logic circuit 220, and an output port.

In some embodiments, the digital logic circuit 220A includes a latch 410A having an input port coupled to an output port of the flip-flop 405B, a select port coupled to the input port 402A(1) of the digital logic circuit 220A, and an output port. In some embodiments, the digital logic circuit 220A includes a latch 410B having an input port coupled to an output port of the flip-flop 405A, a select port coupled to the input port 402A(1) of the digital logic circuit 220A, and an output port.

In some embodiments, the digital logic circuit 220A includes a NAND gate 415A having a first input port coupled to the output port of the flip-flop 405A, a second input port coupled to the output port of the flip-flop 405B, and an output port. In some embodiments, the digital logic circuit 220A includes a NAND gate 415B having a first input port coupled to the output port of the latch 410A, a second input port coupled to the output port of the latch 410B, and an output port.

In some embodiments, the digital logic circuit 220A includes a NAND gate 420A having a first input port coupled to the output port of the flip-flop 405A, a second input port coupled to the output port of the NAND gate 415A, and an output port. In some embodiments, the digital logic circuit 220A includes a NAND gate 425A with an inverting input (e.g., an inverter in series with one of the inputs). In some embodiments, the NAND gate 425A has an inverting input port coupled to the output port of the flip-flop 405A, a non-inverting input port coupled to the output port of the NAND gate 415A, and an output port.

In some embodiments, the digital logic circuit 220A includes a NAND gate 420B having a first input port coupled to the output port of the latch 410A, a second input port coupled to the output port of the NAND gate 415B, and an output port. In some embodiments, the digital logic circuit 220A includes a NAND gate 425B with an inverting input. In some embodiments, the NAND gate 425B has an inverting input port coupled to the output port of the latch 410A, a non-inverting input port coupled to the output port of the NAND gate 415B, and an output port.

In some embodiments, the digital logic circuit 220A includes a NAND gate 420C having a first input port coupled to the output port of the latch 410B, a second input port coupled to the output port of the NAND gate 415B, and an output port. In some embodiments, the digital logic circuit 220A includes a NAND gate 425C with an inverting input. In some embodiments, the NAND gate 425C has an inverting input port coupled to the output port of the latch 410B, a non-inverting input port coupled to the output port of the NAND gate 415B, and an output port.

In some embodiments, the digital logic circuit 220A includes a NAND gate 420D having a first input port coupled to the output port of the flip-flop 405B, a second input port coupled to the output port of the NAND gate 415A, and an output port. In some embodiments, the digital logic circuit 220A includes a NAND gate 425D with an inverting input. In some embodiments, the NAND gate 425D has an inverting input port coupled to the output port of the flip-flop 405B, a non-inverting input port coupled to the output port of the NAND gate 415A, and an output port.

In some embodiments, the digital logic circuit 220A includes an inverting multiplexer 430A having a first positive input port coupled to the output port of NAND gate 420A, a first negative input port coupled to the output port of NAND gate 425A, a second positive input port coupled to the output port of NAND gate 420B, a second negative input port coupled to the output port of NAND gate 425B, a non-inverting select port coupled to the input port 312A(2) of the digital logic circuit 220A, an inverting select port coupled to the input port 312A(1) of the digital logic circuit 220A, a positive output port and a negative output port. In response to a first state of the select ports of the inverting multiplexer 430A, the first positive input port of the inverting multiplexer 430A may be coupled to the positive output port of the inverting multiplexer 430A, via a first inverter of the inverting multiplexer 430A, and the first negative input port of the inverting multiplexer 430A may be coupled to the negative output port of the inverting multiplexer 430A, via a second inverter of the inverting multiplexer 430A. In response to a second state of the select ports of the inverting multiplexer 430A, the second positive input port of the inverting multiplexer 430A may be coupled to the positive output port of the inverting multiplexer 430A, via a third inverter of the inverting multiplexer 430A, and the second negative input port of the inverting multiplexer 430A may be coupled to the negative output port of the inverting multiplexer 430A, via a fourth inverter of the inverting multiplexer 430A.

In some embodiments, the digital logic circuit 220A includes an inverting multiplexer 430B having a first positive input port coupled to the output port of NAND gate 420C, a first negative input port coupled to the output port of NAND gate 425C, a second positive input port coupled to the output port of NAND gate 420D, a second negative input port coupled to the output port of NAND gate 425D, a non-inverting select port coupled to the input port 312A(1) of the digital logic circuit 220A, an inverting select port coupled to the input port 312A(2) of the digital logic circuit 220A, a positive output port and a negative output port. In response to a first state of the select ports of the inverting multiplexer 430B, the first positive input port of the inverting multiplexer 430B may be coupled to the positive output port of the inverting multiplexer 430B, via a first inverter of the inverting multiplexer 430B, and the first negative input port of the inverting multiplexer 430B may be coupled to the negative output port of the inverting multiplexer 430B, via a second inverter of the inverting multiplexer 430B. In response to a second state of the select ports of the inverting multiplexer 430B, the second positive input port of the inverting multiplexer 430B may be coupled to the positive output port of the inverting multiplexer 430B, via a third inverter of the inverting multiplexer 430B, and the second negative input port of the inverting multiplexer 430B may be coupled to the negative output port of the inverting multiplexer 430B, via a fourth inverter of the inverting multiplexer 430B.

In some embodiments, the circuit diagram 400 includes the current steering circuitry 225A(1) of FIG. 3. In some embodiments, the current steering circuitry 225A(1) includes a current source 435A. In some embodiments, the current steering circuitry 225A(1) includes a transistor 440A(1) having an input port coupled to the input port 326A(1) of the current steering circuitry 225A(1), a first output port coupled to the current source 435A, and a second output port coupled to the output port 328A(1) of the current steering circuitry 225A(1). In some embodiments, the transistor 440A(1) is coupled to the output port 328A(1) via a transistor 445A(1) (e.g., cascode device). In some embodiments, the current steering circuitry 225A(1) includes a transistor 440A(2) having an input port coupled to the input port 326A(2) of the current steering circuitry 225A(1), a first output port coupled to the current source 435A, and a second output port coupled to the output port 328A(2) of the current steering circuitry 225A(1). In some embodiments, the transistor 440A(2) is coupled to the output port 328A(2) via a transistor 445A(2). In some embodiments, a select port 450 is coupled to an input of the transistor 445A(1) and an input of the transistor 445A(2). In response to a first voltage level of a bias voltage (e.g., VDD, VDD/2, or the like) received by the select port 450, the output ports 328A(1) and 328A(2) may selectively provide data signals in accordance with the state of the data tuple received by the input of the digital logic circuit 220A. In some embodiments, the first voltage level is adjusted to optimize performance (e.g., noise, linearity, leakage, isolation, load impedance, etc.). In some embodiments, in response to a second voltage level of a bias voltage (e.g., ground) received by the select port 450, the data signals to be selectively provided by the output ports 328A(1) and 328A(2) may be disabled irrespective of the state of the data tuple received by the input of the digital logic circuit 220A. In this configuration, the digital logic circuit 220A may generate RF data bits 222 at the output ports 322A(1), 322A(2), 322A(3), 322A(4), according to the LO signals and the baseband data bits received at the input ports 308A(1), 308A(2).

In some embodiments, the circuit diagram 400 includes the current steering circuitry 225A(2) of FIG. 3. In some embodiments, the current steering circuitry 225A(2) includes a current source 435B. The current steering circuitry 225A(2) includes a transistor 440B(1) having an input port coupled to the input port 327A(1) of the current steering circuitry 225A(2), a first output port coupled to the current source 435B, and a second output port coupled to the output port 329A(1) of the current steering circuitry 225A(2). In some embodiments, the transistor 440B(1) is coupled to the output port 329(1) via a transistor 445B(1). The current steering circuitry 225A(2) includes a transistor 440B(2) having an input port coupled to the input port 327A(2) of the current steering circuitry 225A(2), a first output port coupled to the current source 435B, and a second output port coupled to the output port 329A(2) of the current steering circuitry 225A(2). In some embodiments, the transistor 440B(2) is coupled to the output port 329A(2) via a transistor 445B(2). In some embodiments, the select port 450 is coupled to an input of the transistor 445B(1) and an input of the transistor 445B(2) (e.g., the same select port 450 is coupled to the transistors 445A(1), 445A(2), 445B(1), and 445B(2)). In response to the first state of a select signal received by the select port 450, the output ports 329A(1) and 329A(2) may selectively provide data signals in accordance with the state of the data tuple received by the input of the digital logic circuit 220A. In response to a second state of a select signal received by the select port 450, the data signals to be selectively provided by the output ports 329A(1) and 329A(2) may be disabled irrespective of the state of the data tuple received by the input of the digital logic circuit 220A.

Figure 5:
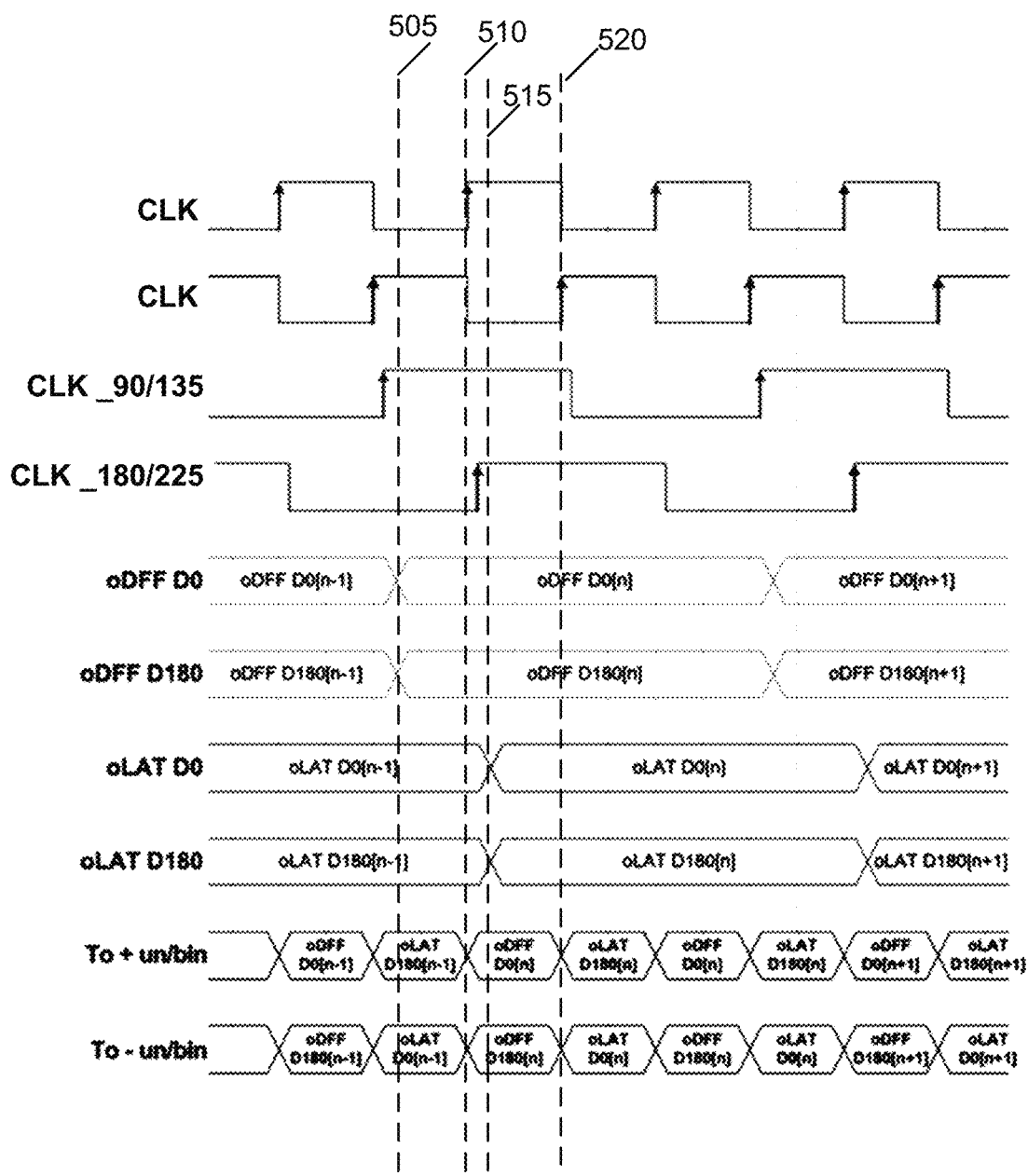
FIG. 5, is a timing diagram of the logic circuit of FIG. 4, in one or more embodiments.

Referring now to FIG. 5, illustrated is a timing diagram 500 of the digital logic circuit 220, in one or more embodiments. At timing event 505, in response to the select port of the flip-flop 405A and the select port of the flip-flop 405B receiving a rising edge (e.g., a signal with a slope greater than a predetermined threshold), the flip-flop 405A may receive and store, at the output port of the flip-flop 405A, a first input bit received at the input port of the flip-flop 405A, and the flip-flop 405B may receive and store, at the output port of the flip-flop 405B, a second input bit received at the input port of the flip flop 405B. At timing event 510, in response to at least one of the select ports of the inverting multiplexer 430A receiving a rising edge, the first positive input port of the inverting multiplexer 430A may be coupled to the positive output of the inverting multiplexer 430A and the first negative input port of the inverting multiplexer 430A may be coupled to the negative output of the inverting multiplexer 430A. Similar operation applies to the inverting multiplexer 430B.

At timing event 515, in response to the select port of the latch 410A and the select port of the latch 410B receiving high level (e.g., a signal with a level greater than a predetermined threshold), the input port of the latch 410A may be coupled to the output port of the latch 410A and the input port of the latch 410B may be coupled to the output port of the latch 410B. At timing event 520, in response to at least one of the select ports of the inverting multiplexer 430A receiving a rising edge, the second positive input port of the inverting multiplexer 430A may be coupled to the positive output of the inverting multiplexer 430A and the second negative input port of the inverting multiplexer 430A may be coupled to the negative output of the inverting multiplexer 430A. Similar operation applies to the inverting multiplexer 430B. In some embodiments, a first frequency of the first input bit received by the flip-flop 405A and the second input bit received by the flip-flop 405B is lower than a second frequency of a first bit having the rising edge received by the inverting multiplexer 430A and a second bit having a second rising edge received by the inverting multiplexer 430B. In some embodiments, the first bit at the first frequency is up-converted to generate a first output bit of at least one of the inverting multiplexer 430A and the inverting multiplexer 430B at the second frequency and the second bit at the first frequency is up-converted to generate a second output bit of at least one of the inverting multiplexer 430A and the inverting multiplexer 430B at the second frequency. Advantageously, in some embodiments, the first input bit and the second input bit can be at a lower first frequency while the system 100 generates RF signals at a specified carrier frequency.

Figure 6:
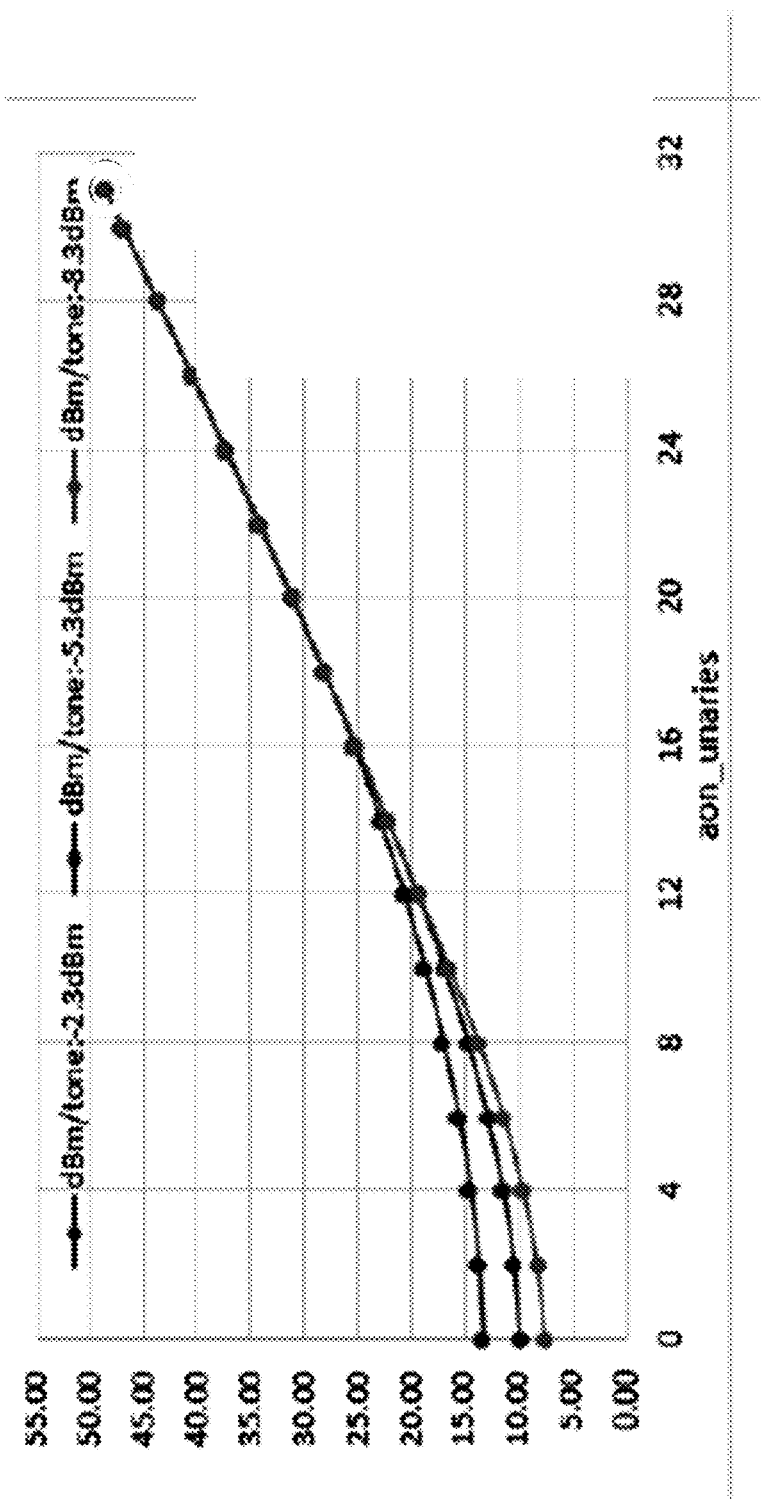
FIG. 6 is a plot showing an improvement in current consumption by selectively using the fourth state of the data tuple, in one or more embodiments.

Referring to FIG. 6 is a plot 600 showing an improvement in current consumption by selectively using the fourth state (e.g., the gated OFF state) of the data tuple at the input of the digital logic circuit 220, in one or more embodiments. In FIG. 6, X-Axis represents a number of steering current circuitries that are enabled, and Y-Axis represents an amplitude (or magnitude) of current consumption for a voltage supply (e.g., VDD) that is coupled to the steering circuit circuitries. The plot 600 shows current consumption based on different current steering circuitries. For example, the farthest point on the right side of the plot shows a setting where all 32 the current steering circuitries are on or enabled. By using the fourth state in about half of the current steering circuitries, the current consumption is reduced by about a factor of 2, as shown by the point corresponding 16 current steering circuitries being on. In one aspect, power consumption in current-steering architectures without the disclosed embodiments may be set by peak signal swings, regardless of how infrequent the peaks occur. The power consumption in such current-steering architectures without the disclosed embodiments may not scale as the signal amplitude is reduced. Advantageously, embodiments of the disclosure herein can disable selected current steering circuitries depending on one or more factors including the average output power, error vector magnitude (EVM), modulation and coding scheme (MCS), spectral mask, and the like, to achieve power efficiency without degrading signal quality.

Figure 7:
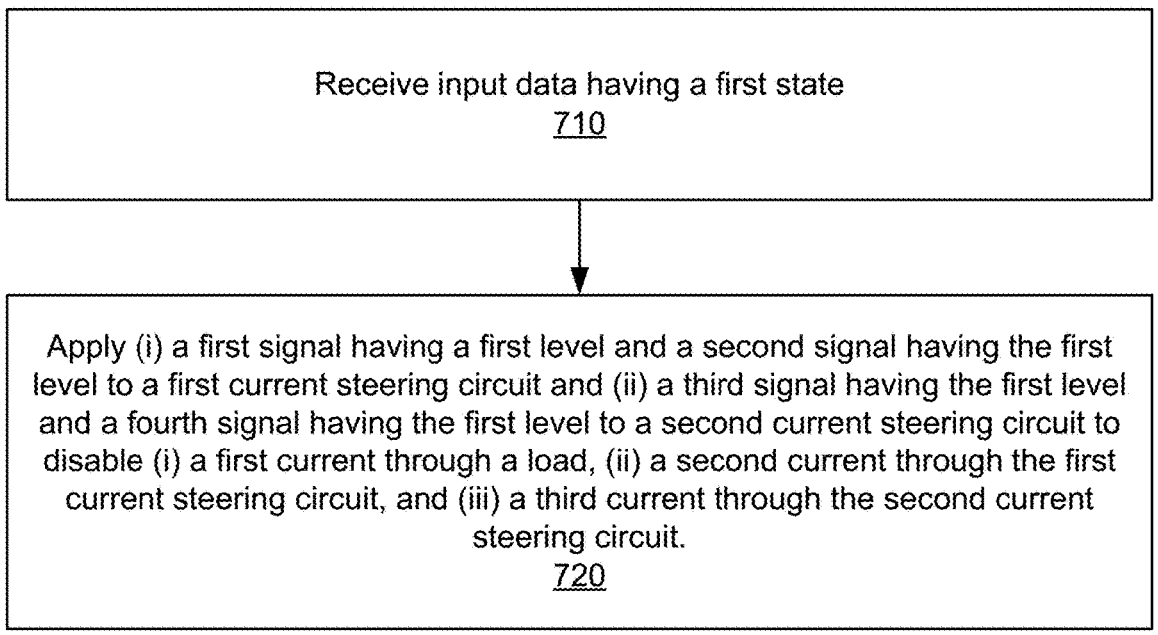
FIG. 7 is a flow chart depicting a process of disabling a pair of current steering circuits using input data, in one or more embodiments.

Referring to FIG. 7, illustrated is a flow chart depicting a process 700 of disabling a pair of current steering circuits using input data, in one or more embodiments. In some embodiments, the process 700 is performed by the system 200 shown in FIG. 2 or the system 300 shown in FIG. 3. In other embodiments, the process 700 is performed by other entities. In some embodiments, the process 700 includes more, fewer, or different steps than shown in FIG. 7.

At operation 710, the system receives input data having a first state. For example, the input data having a first state includes a first bit with a voltage level of VDD and a second bit with a voltage level of VDD. In some embodiments, the system selects the first state for the input data. In some embodiments, the system selects the first state based on determining that (a) a current steering circuitry is providing signal to the output less than a predetermined amount or percentage of time within a predetermined time period, and (b) the current steering circuitry is not scheduled to currently provide the signal to the output.

At operation 720, the system applies (i) a first signal having a first level and a second signal having the first level to a first current steering circuit and (ii) a third signal having the first level and a fourth signal having the first level to a second current steering circuit to disable (i) a first current through a load, (ii) a second current through the first current steering circuit, and (iii) a third current through the second current steering circuit. In some embodiments, the system includes a balun including a first inductor and a second inductor coupled to the first inductor, in which the second inductor is the load, the first current steering circuit is coupled to the first inductor, the second current steering circuit is coupled to the first inductor, and a controller is coupled to the first current steering circuit and the second current steering circuit.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A system comprising:
    a balun comprising a first inductor and a second inductor coupled to the first inductor;
    a first current steering circuit coupled to the first inductor;
    a second current steering circuit coupled to the first inductor; and
    a controller coupled to the first current steering circuit and the second current steering circuit, the controller configured to:

based on input data having a first state, apply (i) a first signal having a first level and a second signal having a second level to the first current steering circuit and (ii) a third signal having the second level and a fourth signal having the first level to the second current steering circuit to generate a first current through the second inductor, and based on the input data having a second state, apply (i) the first signal having the second level and the second signal having the second level to the first current steering circuit and (ii) the third signal having the second level and the fourth signal having the second level to the second current steering circuit to disable (i) the first current through the second inductor, (ii) a second current through the first current steering circuit, and (iii) a third current through the second current steering circuit.

2. The system of claim 1,
wherein the first inductor includes a first port, a second port, and a third port between the first port and the second port, wherein the third port is coupled to a source providing a reference voltage,
wherein the first current steering circuit includes:
  a first output coupled to the first port of the first inductor; and
  a second output coupled to the second port of the first inductor, and
wherein the second current steering circuit includes:
  a third output coupled to the second port of the first inductor; and
  a fourth output coupled to the first port of the first inductor.

3. The system of claim 2, wherein, in response to the input data having the first state, the second current flows through the third port of the first inductor, the first port of the first inductor, and the first output of the first current steering circuit in that sequence, and the third current flows through the third port of the first inductor, the first port of the first inductor, and the fourth output of the second current steering circuit in that sequence.

4. The system of claim 2, wherein, in response to the input data having a third state, the second current flows through the third port of the first inductor, the second port of the first inductor, and the second output of the first current steering circuit in that sequence, and the third current flows through the third port of the first inductor, the second port of the first inductor, and the third output of the second current steering circuit in that sequence.

5. The system of claim 4, wherein, in response to the input data having a fourth state, the second current flows through the third port of the first inductor, the first port of the first inductor, and the first output of the first current steering circuit in that sequence, and the third current flows through the third port of the first inductor, the second port of the first inductor, and the third output of the second current steering circuit in that sequence to enable the second current from the first current steering circuit to cancel the third current from the second current steering circuit.

6. The system of claim 2, wherein the first current steering circuit includes:
  a first current source, and
  a first differential pair circuit including a first transistor and a second transistor, the first transistor coupled between (i) the first current source and (ii) the first output, and the second transistor coupled between (i) the first current source and (ii) the second output.

7. The system of claim 6, wherein the second current steering circuit includes:
  a second current source, and
  a second differential pair circuit including a third transistor and a fourth transistor, the third transistor coupled between (i) the second current source and (ii) the third output, and the fourth transistor coupled between (i) the second current source and (ii) the fourth output.

8. The system of claim 7, wherein the first current steering circuit includes:
  a first switch transistor, the first transistor and the first switch transistor coupled to each other in series between (i) the first current source and (ii) the first output, and
  a second switch transistor, the second transistor and the second switch transistor coupled to each other in series between (i) the first current source and (ii) the second output.

9. The system of claim 8, wherein the second current steering circuit includes:
  a third switch transistor, the third transistor and the third switch transistor coupled to each other in series between (i) the second current source and (ii) the third output, and
  a fourth switch transistor, the fourth transistor and the fourth switch transistor coupled to each other in series between (i) the second current source and (ii) the fourth output.

10. The system of claim 7, wherein the controller is configured to apply the first signal to the first transistor, the second signal to the second transistor, the third signal to the third transistor, and the fourth signal to the fourth transistor.

11. A system comprising:
a balun comprising a first inductor and a second inductor coupled to the first inductor;
a first current steering circuit coupled to the first inductor;
a second current steering circuit coupled to the first inductor; and
a controller coupled to the first current steering circuit and the second current steering circuit, the controller configured to:
  based on input data having a first state, apply (i) a first signal having a first level and a second signal having a second level to the first current steering circuit and (ii) a third signal having the first level and a fourth signal having the second level to the second current steering circuit to generate a first current through the first current steering circuit that cancels a second current through the second current steering circuit, and
  based on the input data having a second state, apply (i) the first signal having the second level and the second signal having the second level to the first current steering circuit and (ii) the third signal having the second level and the fourth signal having the second level to the second current steering circuit to disable (i) a third current through the second inductor, (ii) the first current through the first current steering circuit, and (iii) the second current through the second current steering circuit.

12. The system of claim 11,
wherein the first inductor includes a first port, a second port, and a third port between the first port and the second port, wherein the third port is coupled to a source providing a reference voltage,
wherein the first current steering circuit includes:

a first output coupled to the first port of the first inductor; and a second output coupled to the second port of the first inductor, and wherein the second current steering circuit includes:

a third output coupled to the second port of the first inductor; and a fourth output coupled to the first port of the first inductor.

13. The system of claim 12, wherein, in response to the input data having the first state, the first current flows through the third port of the first inductor, the first port of the first inductor, and the first output of the first current steering circuit in that sequence, and the second current flows through the third port of the first inductor, the second port of the first inductor, and the third output of the second current steering circuit in that sequence to enable the first current from the first current steering circuit to cancel the second current from the second current steering circuit.

14. The system of claim 12, wherein, in response to the input data having a third state, the first current flows through the third port of the first inductor, the port input of the first inductor, and the first output of the first current steering circuit in that sequence, and the second current flows through the third port of the first inductor, the first port of the first inductor, and the fourth output of the second current steering circuit in that sequence.

15. The system of claim 12, wherein the first current steering circuit includes:

a first current source, and a first differential pair circuit including a first transistor and a second transistor, the first transistor coupled between (i) the first current source and (ii) the first output, and the second transistor coupled between (i) the first current source and (ii) the second output.

16. The system of claim 15, wherein the second current steering circuit includes:

a second current source, and a second differential pair circuit including a third transistor and a fourth transistor, the third transistor coupled between (i) the second current source and (ii) the third output, and the fourth transistor coupled between (i) the second current source and (ii) the fourth output.

17. The system of claim 16, wherein the first current steering circuit includes:

a first switch transistor, the first transistor and the first switch transistor coupled to each other in series between (i) the first current source and (ii) the first output, and a second switch transistor, the second transistor and the second switch transistor coupled to each other in series between (i) the first current source and (ii) the second output.

18. The system of claim 16, wherein the controller is configured to apply the first signal to the first transistor, the second signal to the second transistor, the third signal to the third transistor, and the fourth signal to the fourth transistor.

19. A system comprising:

a balun comprising a first inductor and a second inductor coupled to the first inductor;

a first current steering circuit coupled to the first inductor;

a second current steering circuit coupled to the first inductor; and a controller coupled to the first current steering circuit and the second current steering circuit, the controller configured to, based on input data having a first state, apply (i) a first signal having a first level and a second signal having the first level to the first current steering circuit and (ii) a third signal having the first level and a fourth signal having the first level to the second current steering circuit to disable (i) a first current through the second inductor, (ii) a second current through the first current steering circuit, and (iii) a third current through the second current steering circuit, wherein the first inductor includes a first port and a second port, wherein the first current steering circuit includes:

a first output coupled to the first port of the first inductor; and a second output coupled to the second port of the first inductor, and wherein the second current steering circuit includes:

a third output coupled to the second port of the first inductor; and a fourth output coupled to the first port of the first inductor.

20. The system of claim 19, wherein, the first current steering circuit includes:

a first current source, and a first differential pair circuit including a first transistor and a second transistor, the first transistor coupled between (i) the first current source and (ii) the first output, and the second transistor coupled between (i) the first current source and (ii) the second output.

* * * * *